US 6,586,997 B1

(12) United States Patent
D'Aquino et al.

(10) Patent No.: US 6,586,997 B1
(45) Date of Patent: Jul. 1, 2003

(54) INPUT DISTORTION CORRECTION CURRENT-FEEDBACK AMPLIFIER SYSTEM

(75) Inventors: Stefano D'Aquino, Westford, MA (US); Kimo Y. F. Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/060,829

(22) Filed: Jan. 30, 2002

(51) Int. Cl.⁷ .................................................. H03F 3/45
(52) U.S. Cl. ....................................... 330/257; 330/292
(58) Field of Search .............................. 330/257; 9/260, 9/292

(56) References Cited

U.S. PATENT DOCUMENTS 5,418,495 A * 5/1995 Harvey ........................ 330/292
5,537,079 A * 7/1996 Gosser et al. ................ 330/267
6,377,126 B1 * 4/2002 Guedon ....................... 330/288

* cited by examiner

Primary Examiner—Robert Pascal
Assistant Examiner—Khanh Van Nguyen
(74) Attorney, Agent, or Firm—Iandiorio & Teska

(57) ABSTRACT

An input distortion correction current-feedback amplifier system includes a current mirror; an input stage connected to the input of the current mirror; an output stage connected to the output of the current mirror; a feedback circuit connected from the output stage to the input stage; a compensation impedance connected to the output of the current mirror; and a distortion correction circuit for sensing the distortion voltage across the input stage and providing to the current mirror a current representative of the distortion voltage for delivering to the compensation impedance a correction current to develop a correction voltage at the input of the output stage to nullify the effect of the distortion voltage.

15 Claims, 4 Drawing Sheets

INPUT DISTORTION CORRECTION CURRENT-FEEDBACK AMPLIFIER SYSTEM

FIELD OF THE INVENTION

This invention relates to an input distortion correction current-feedback amplifier system.

BACKGROUND OF THE INVENTION

Current feedback amplifier systems typically employ one or more signal current mirrors, an input stage coupled to the input of the current mirror, an output stage coupled to the output of the current mirror and a compensation impedance typically a capacitor which is charged by the current mirror to the voltage required to operate the output stage. A feedback current flows from the output stage to the inverting input of the input stage through a feedback element, typically a resistor. Ideally the system has a high impedance input for receiving signals with a low current drive capability and linearly reproduces those signals at its output with a high current drive capability. A problem arises however because transistor $\Delta V_{be}$'s introduce distortion in the input stage resulting in non-linear performance.

BRIEF SUMMARY OF THE INVENTION

It is therefore an object of this invention to provide an improved input distortion correction amplifier system.

It is a further object of this invention to provide such an improved input distortion correction amplifier system compatible with current feedback amplifiers.

It is a further object of this invention to provide such an improved input distortion correction amplifier system which is simple and effective and doesn't limit voltage headroom.

It is a further object of this invention to provide such an improved input distortion correction amplifier system which corrects for the distortion at the compensating impedance and does not interfere with the input stage.

It is a further object of this invention to provide such an improved input distortion correction amplifier system which directly senses the distortion voltage at the input stage.

It is a further object of this invention to provide such an improved input distortion correction amplifier system which does not introduce common mode errors.

This invention results from the realization that input distortion correction can be achieved simply and effectively in current feedback amplifier systems by sensing the distortion voltage across the input stage, which induces a distortion current in the feedback circuit, developing a current representative of the distortion voltage and submitting that current to a current mirror which develops a correction current equal and opposite to the distortion current for charging the compensation capacitor to provide to the output stage a voltage input that nullifies the effect of the distortion voltage.

This invention features an input distortion correction current-feedback amplifier system including a current mirror, an input stage connected to the input of the current mirror, and output stage connected to the output of the current mirror. A feedback circuit is connected from the output stage to the input stage. A compensation impedance is connected to the output of the current mirror. A distortion correction circuit senses the distortion voltage across the input stage and provides to the current mirror a current representative of the distortion voltage for delivery to the compensation impedance for delivering to the compensation impedance a correction current to develop a correction voltage at the input of the output stage to nullify the effect of the distortion voltage.

In a preferred embodiment the distortion voltage may induce a distortion current in the feedback circuit and the correction current may be equal and opposite to that distortion current. The compensation impedance may include a capacitor. The current mirror may include a pair of current mirror circuits. The distortion correction circuit may include a pair of buffer amplifiers with their low impedance outputs connected to a correction resistance and at least one of their high impedance outputs connected to the current mirror. The pair of buffer amplifiers may have left to right symmetry for reducing common mode errors. The feedback circuit may include a feedback and a gain resistance and the correction resistance may have a value equal to twice the parallel combination of the feedback and gain resistances. The gain resistance may approach an open circuit. The distortion correction circuit may include a buffer amplifier with its low impedance output connected to a correction resistance and at least one of its high impedance outputs connected to the current mirror. The feedback circuit may include a feedback and a gain resistance and the correction resistance may have a value equal to the parallel combination of the feedback and gain resistance.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
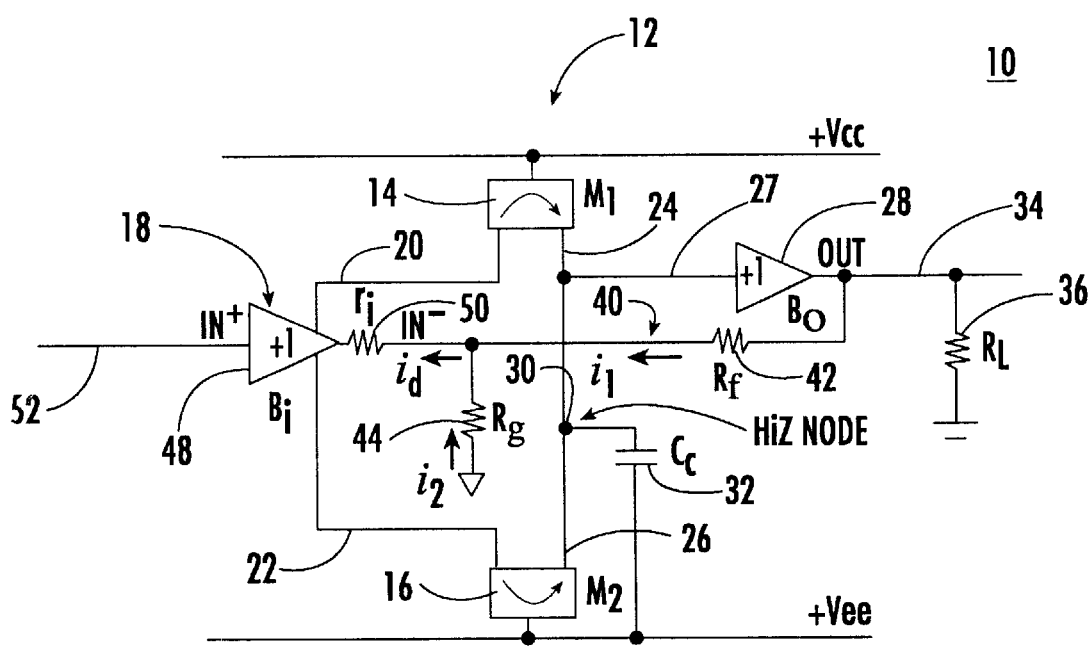
FIG. 1 is a schematic block diagram of a prior art current feedback amplifier.

There is shown in FIG. 1 a current feedback amplifier 10 including current mirror 12 having a pair of current mirror circuits 14 and 16. An input stage 18 has its high impedance outputs 20 and 22 connected to the input side of current mirror circuits 14 and 16, respectively. The outputs 24 and 26 of current mirror circuits 14 and 16, respectively, are connected to the input 27 of output stage 28 and to high impedance node 30 connected to compensation impedance 32, e.g., capacitor $C_c$. Output 34 of output stage 28 drives load resistance 36. A feedback circuit 40 including feedback resistance 42 and gain resistance 44 is connected from the output 34 of output stage 28 to the low impedance output of input stage 18. Input stage 18 is shown as including buffer amplifier 48 and resistance 50 which represents the internal output resistance of buffer amplifier 48. Buffer 48 includes a pair of high impedance nodes 20 and 22 which carry a combined signal current equal to the signal current flowing through resistance 50. Input signals are delivered to the system at high impedance input 52. The distortion voltage which develops across buffer amplifier 48 due to non-linear resistance 50 causes a distortion current $i_d$ to flow that is a combination of the partial distortion current $i_1$ flowing through feedback resistor 42 and the partial distortion current $i_2$ flowing through gain resistance 44.

Ideally, an input signal arriving at input 52 is linearly reproduced at the output 34 amplified and able to deliver significant current to load resistance 36. Practically, linearity is compromised because of the voltage distortion that occurs in buffer amplifier 48 due to $\Delta V_{be}$ errors, modeled by resistor 50. For example, with buffer 48 being a unity gain buffer, one would expect the voltage at the input 52 to be the same as the voltage at the output beyond resistance 50. However, this is not the case. This distortion of the voltage changes the currents flowing at high impedance outputs 20 and 22 which in turn causes current mirror circuits 14 and 16 to change the currents at their outputs 24 and 26. This causes a change in the charging current associated with capacitor 32 which then changes the voltage at the input 27 to output stage 28 thereby introducing non-linearity in the system.

Figure 2:
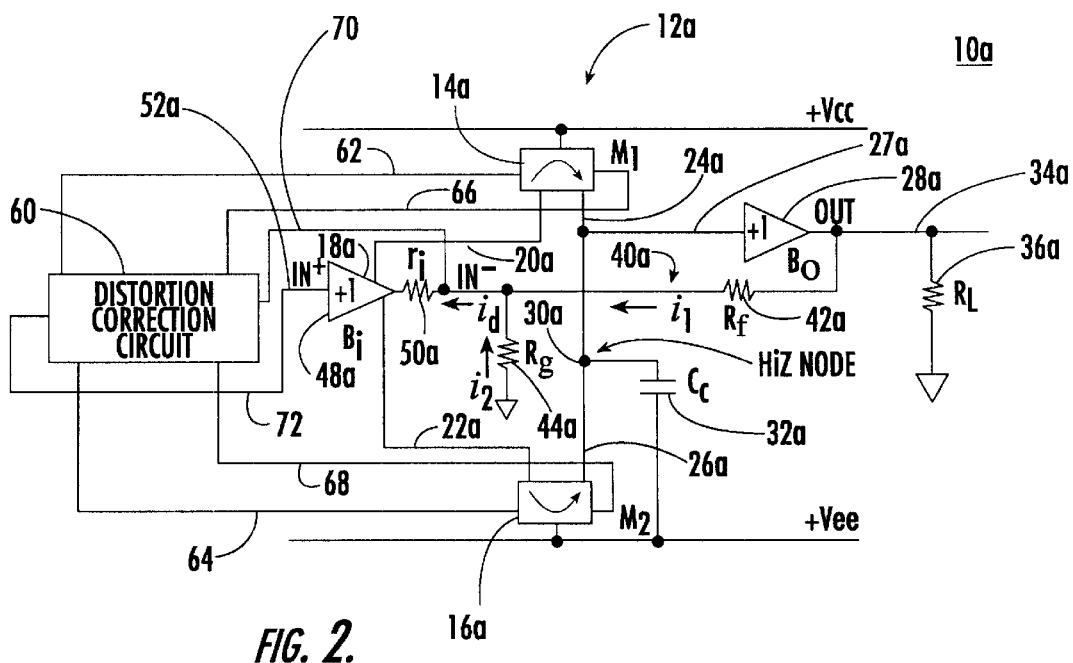
FIG. 2 is a view similar to FIG. 1 of a current feedback amplifier with input distortion correction according to this invention.

To combat this problem in accordance with this invention, a distortion correction circuit 60, FIG. 2 is added, which senses on lines 70 and 72 the distortion voltage across buffer amplifier 18a and resistance 50a and provides a current representative of that voltage over lines 62 and 64 and lines 66 and 68 to current mirror circuits 14a and 16a. Current mirror circuits 14a and 16a then develop a correction current which is equal and opposite to the distortion current. This distortion voltage gives rise to the distortion current $i_d$ which is comprised of partial distortion currents $i_1$ and $i_2$ flowing through feedback resistance 42a and gain resistance 44a, respectively and is delivered to current mirror circuits 14a and 16a. The gain resistance may approach an open circuit. There this current generates a correction current which is equal and opposite to the distortion current $i_d$. This correction current is delivered to capacitor 32a at high impedance node 30a where it develops a voltage provided to input 27a of output stage 28a which will nullify the effects of the distortion voltage at the input stage 18a.

Figure 3:
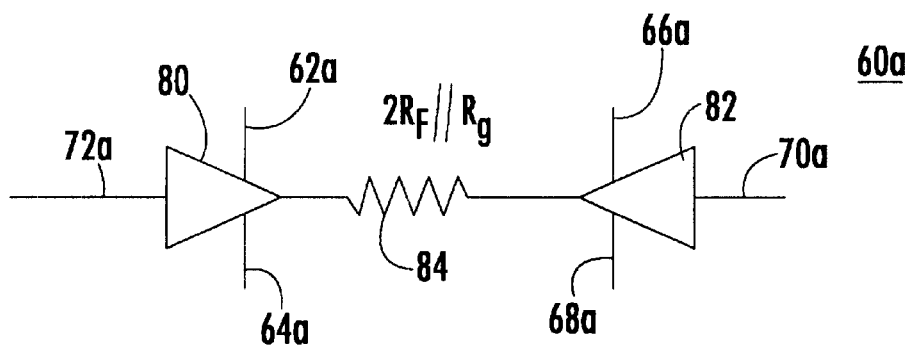
FIG. 3 is a more detailed view of one implementation of the distortion correction circuit of FIG. 2.

Distortion correction circuit as shown in 60a, FIG. 3 may include two buffer amplifiers 80 and 82 whose low impedance outputs are connected to a correction resistance 84. The high impedance outputs of each buffer amplifier 82 that is outputs 62a and 64a and 66a and 68a, respectively, are provided to the current mirror circuits 14a and 16a. Since there are two buffer amplifiers 80 and 82 in this implementation there will be twice the current flow and so correction resistance 84 will have a value of twice the parallel combination of the feedback resistance $R_F$ and the gain resistance $R_G$. Although all four high impedance outputs are connected to the current mirror 12a, this is not a necessary limitation of the invention, for example only two of the high impedance outputs could be used, for example 62a and 66a with the exclusion of 64a and 68a or 64a and 68a could be used with the exclusion of 62a and 66a.

Figure 4:
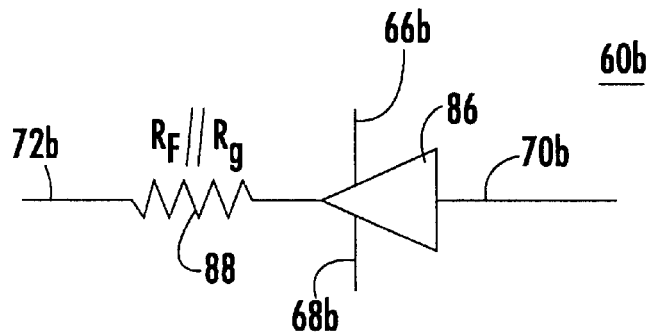
FIG. 4 is a more detailed view of another implementation of the distortion correction circuit of FIG. 2.

In another implementation of distortion correction circuit 60b, FIG. 4 only a single buffer amplifier 86 may be used. In that case the correction resistance 88 is simply equivalent to the parallel combination of the gain resistance $R_G$ and the feedback resistance $R_F$. Again, either one or both of the high impedance outputs 66b and 68b can be connected to the current mirror 12a.

Figure 5:
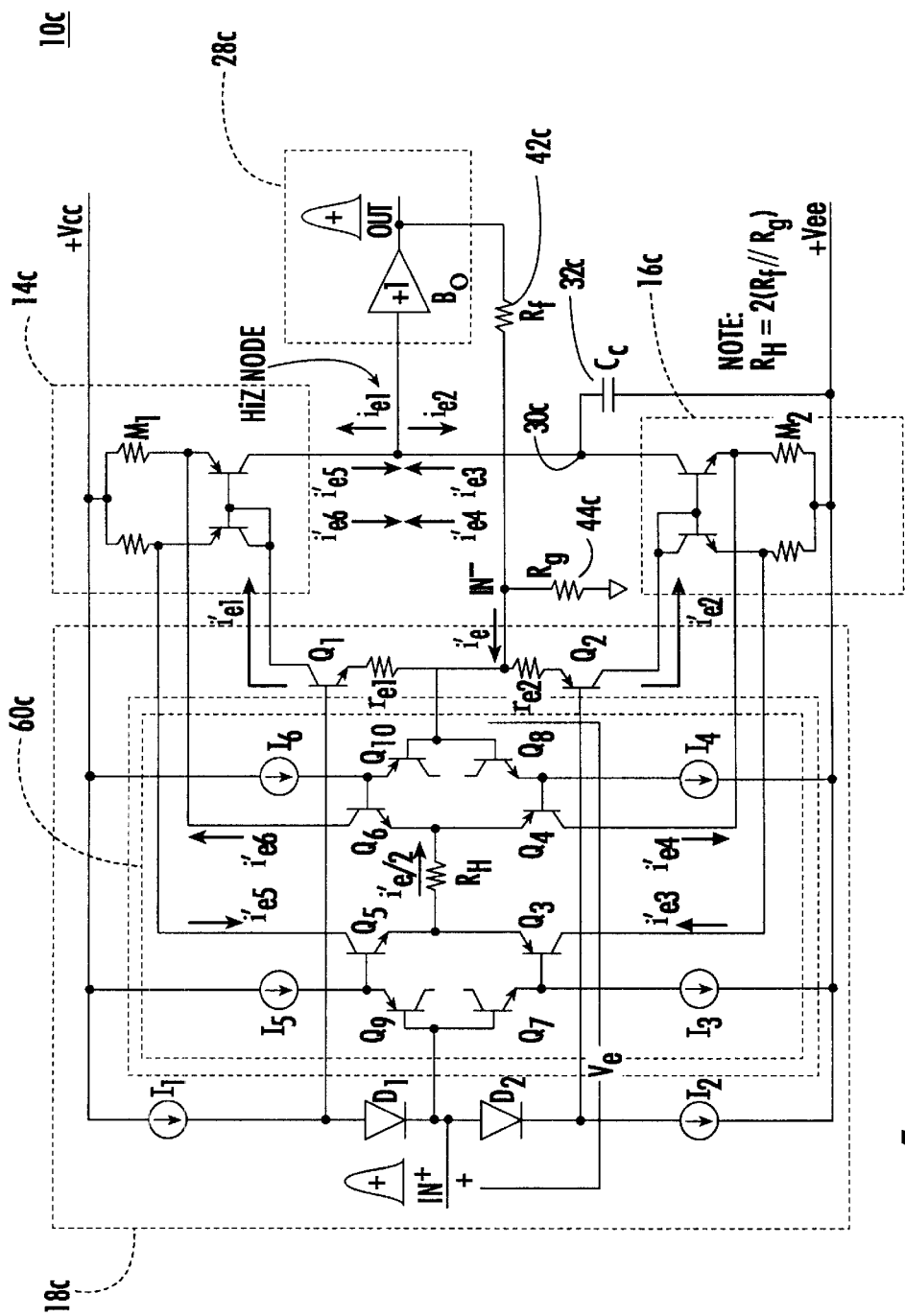
FIG. 5 is a schematic diagram in greater detail of the current feedback amplifier of FIG. 2.

A more detailed implementation of the input distortion correction current amplifier system according to this invention is shown in FIG. 5 where it can be seen that the distortion currents $i_{e1}$ and $i_{e2}$ at the output stage 28c are nullified by the correction currents $i_{e3}$ through $i_{e6}$. It is also noteworthy that due to the left-right symmetry structure of the distortion correction circuit according to this invention, the common mode error currents which are generated mutually cancel each other so no common mode error problem is introduced by the circuitry.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. An input distortion correction current-feedback amplifier system comprising:
   a current mirror;
   an input stage connected to the input of said current mirror;
   an output stage connected to the output of said current mirror;
   a feedback circuit connected from the output stage to the input stage;
   a compensation impedance connected to the output of said current mirror; and
   a distortion correction circuit for sensing the distortion voltage across said input stage and providing to said current mirror a current representative of said distortion voltage for delivering to said compensation impedance a correction current to develop a correction voltage at the input of said output stage to nullify the effect of said distortion voltage.

2. The input distortion correction current-feedback amplifier system of claim 1 in which the distortion voltage induces a distortion current in said feedback circuit and said correction current is equal and opposite to said distortion current.

3. The input distortion correction current-feedback amplifier system of claim 1 in which said compensation impedance includes a capacitor.

4. The input distortion correction current-feedback amplifier system of claim 1 in which said current mirror includes a pair of current mirror circuits.

5. The input distortion correction current-feedback amplifier system of claim 1 in which said distortion correction circuit includes a pair of buffer amplifiers with their low-impedance outputs connected to a correction resistance and at least one of their high impedance outputs connected to said current mirror.

6. The input distortion correction current-feedback amplifier system of claim 5 in which said pair of buffer amplifiers maintain left-to-right symmetry, with reduced common mode errors.

7. The input distortion correction current-feedback amplifier system of claim 5 in which said feedback circuit includes a feedback and a gain resistance and said correction resistance has a value equal to twice the parallel combination of the feedback and gain resistances.

8. The input distortion correction current-feedback amplifier system of claim 7 in which said gain resistance approaches an open circuit.

9. The input distortion correction current-feedback amplifier system of claim 1 in which said distortion correction circuit includes a buffer amplifier with its low impedance output connected to a correction resistance and at least one of its high impedance outputs connected to said current mirror.

10. The input distortion correction current-feedback amplifier system of claim 9 in which said feedback circuit includes a feedback and a gain resistance and said correction resistance has a value equal to the parallel combination of the feedback and gain resistances.

11. An input distortion correction current-feedback amplifier system comprising:
- a current mirror;
- an input stage connected to the input of said current mirror;
- an output stage connected to the output of said current mirror;
- a feedback circuit connected from the output stage to the input stage;
- a compensation impedance connected to the output of said current mirror; and
- a distortion correction circuit for sensing the distortion voltage across said input stage and providing to said current mirror a current representative of said distortion voltage for delivering to said compensation impedance a correction current to develop a correction voltage at the input of said output stage to nullify the effect of said distortion voltage, wherein the distortion voltage induces a distortion current in said feedback circuit and said correction current is equal and opposite to said distortion current.

12. An input distortion correction current-feedback amplifier system comprising:
- a current mirror;
- an input stage connected to the input of said current mirror;
- an output stage connected to the output of said current mirror;
- a feedback circuit connected from the output stage to the input stage;
- a compensation impedance connected to the output of said current mirror; and
- a distortion correction circuit for sensing the distortion voltage across said input stage and providing to said current mirror a current representative of said distortion voltage for delivering to said compensation impedance a correction current to develop a correction voltage at the input of said output stage to nullify the effect of said distortion voltage, said distortion correction circuit including a pair of buffer amplifiers with their low-impedance outputs connected to a correction resistance and at least one of their high impedance outputs connected to said current mirror.

13. The input distortion correction current-feedback amplifier system of claim 12 in which said pair of buffer amplifiers maintains left-to-right symmetry, with reduced common mode errors.

14. The input distortion correction current-feedback amplifier system of claim 12 in which said feedback circuit includes a feedback and a gain resistance and said correction resistance has a value equal to twice the parallel combination of the feedback and gain resistances.

15. The input distortion correction current-feedback amplifier system of claim 14 in which said gain resistance approaches an open circuit.

* * * * *